(12) United States Patent
Chen et al.

(10) Patent No.: US 12,094,872 B2
(45) Date of Patent: Sep. 17, 2024

(54) CAPACITOR IN NANOSHEET

(71) Applicant: Taiwan Semiconductor Manufacturing Company, Ltd., Hsinchu (TW)

(72) Inventors: Chung-Hui Chen, HsinChu (TW); Wan-Te Chen, Danshui (TW); Shu-Wei Chung, Taichung (TW); Tung-Heng Hsieh, Zhudong (TW); Tzu-Ching Chang, Dali (TW); Tsung-Hsin Yu, Hsinchu (TW); Yung Feng Chang, HsinChu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 426 days.

(21) Appl. No.: 17/643,651

(22) Filed: Dec. 10, 2021

(65) Prior Publication Data
US 2022/0278093 A1    Sep. 1, 2022

Related U.S. Application Data

(60) Provisional application No. 63/166,531, filed on Mar. 26, 2021, provisional application No. 63/154,539, filed on Feb. 26, 2021.

(51) Int. Cl.
*H01L 27/06* (2006.01)
*H01L 29/06* (2006.01)
*H01L 29/423* (2006.01)
*H01L 29/786* (2006.01)

(52) U.S. Cl.
CPC ...... *H01L 27/0629* (2013.01); *H01L 29/0653* (2013.01); *H01L 29/0673* (2013.01); *H01L 29/42392* (2013.01); *H01L 29/78696* (2013.01)

(58) Field of Classification Search
CPC ............ H01L 27/0629; H01L 29/0653; H01L 29/0673; H01L 29/42392; H01L 29/78696
USPC ............................................. 257/347
See application file for complete search history.

(56) References Cited

U.S. PATENT DOCUMENTS

2021/0349691 A1* 11/2021 Hekmatshoartabari ................ H01L 29/42392

* cited by examiner

*Primary Examiner* — Nduka E Ojeh
*Assistant Examiner* — Laura M Dykes
(74) *Attorney, Agent, or Firm* — MERCHANT & GOULD P.C.

(57) ABSTRACT

A semiconductor device includes a substrate. A first nanosheet structure and a second nanosheet structure are disposed on the substrate. Each of the first and second nanosheet structures have at least one nanosheet forming source/drain regions and a gate structure including a conductive gate contact. A first oxide structure is disposed on the substrate between the first and second nanosheet structures. A conductive terminal is disposed in or on the first oxide structure. The conductive terminal, the first oxide structure and the gate structure of the first nanosheet structure define a capacitor.

20 Claims, 16 Drawing Sheets

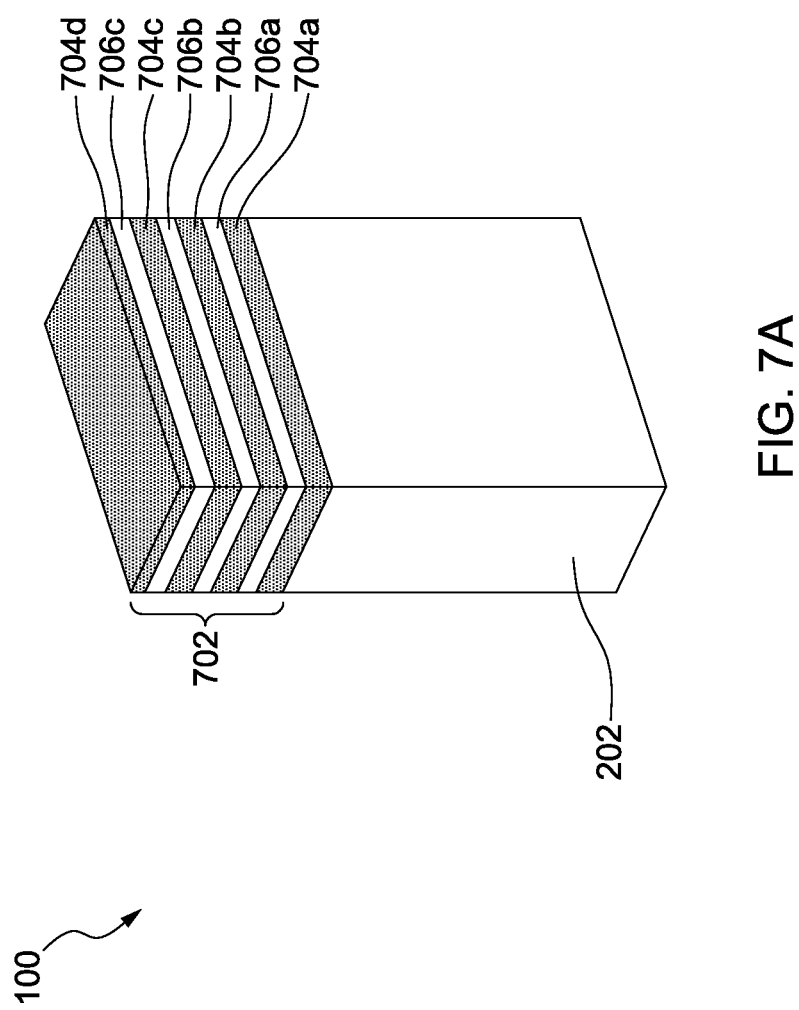

CAPACITOR IN NANOSHEET

CROSS-REFERENCE TO RELATED APPLICATION

This application claims the benefit of U.S. Provisional Patent Application No. 63/166,531, entitled "VERTICAL METAL-OXIDE-METAL (MOM) CAPACITANCE IN NANOSHEET," filed on Mar. 26, 2021, and U.S. Provisional Patent Application No. 63/154,539, entitled "VERTICAL METAL DIFFUSION-P TYPE OXIDE (MD-PO) CAPACITANCE IN NANOSHEET SOURCE/DRAIN WITHOUT EPITAXIAL (EPI) FILL," filed on Feb. 26, 2021. Both of these applications are incorporated herein by reference in their entirety for all that they teach and for all purposes.

BACKGROUND

Capacitors are common components within the internal structure of semiconductor devices. For example, 30% or more of the analog area of a semiconductor device may be covered by capacitors. About 10% or more of the digital area of a semiconductor may be covered by capacitors. Higher capacitance density (e.g., including more capacitors in a smaller area) provides the advantages of having a smaller die area and lowering the die cost. Further, the capacitance density generally needs to increase from generation to generation of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A is an isometric view of the structures formed to form the device(s) as described herein in accordance with examples of the present application.

DETAILED DESCRIPTION

Figure 1A:
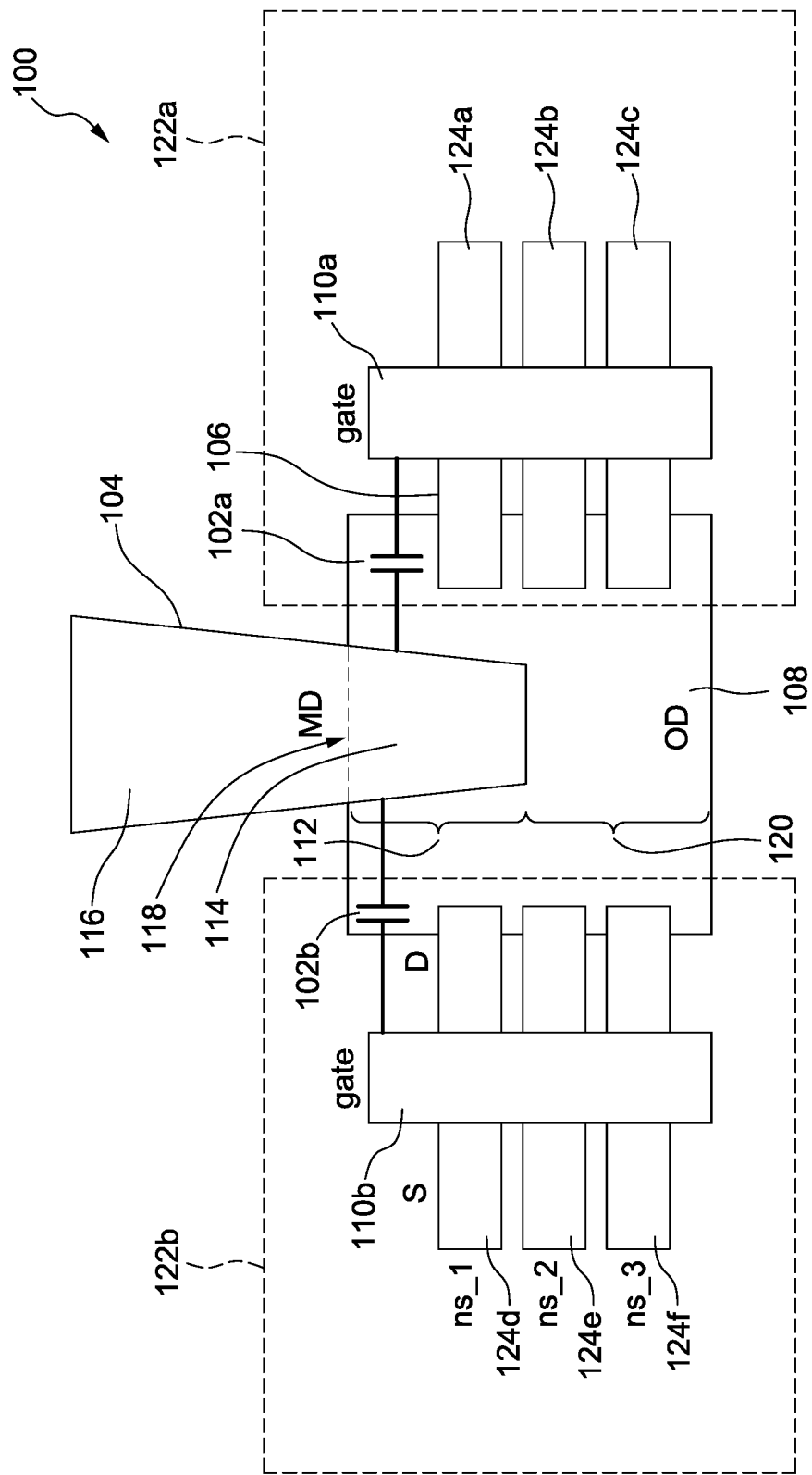
FIG. 1A is a sectional view block diagram illustrating aspects of an example semiconductor device in accordance with examples of the present application.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include examples in which the first and second features are formed in direct contact, and may also include examples in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various examples and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the drawings, the thickness and width of layers and regions may be exaggerated for explanation purposes. Like reference numerals in the drawings denote like elements. The elements and regions illustrated in the figures are schematic in nature, and thus relative sizes or intervals illustrated in the figures are not intended to limit the scope of an inventive concept.

Higher capacitance density (e.g., including more capacitors in a smaller area) provides the advantages of having a smaller die area and lowering the die cost. Further, the capacitance density generally needs to increase from generation to generation of semiconductor devices. To provide low leakage and high capacitance density, many previous capacitors were built as Input/Output (I/O) oxide Metal-Oxide-Semiconductor Field-Effect Transistors (MOSFETs) or passive metal-dielectric-metal (MDM) capacitors. Unfortunately, the core MOSFETs' gate leakage is too high to apply as capacitors. Further, both I/O oxide MOSFETs and known passive MDM capacitors may require extra masks to build these capacitors. In other words, higher capacitance density needs extra masks. Other capacitors that may be used include Metal-Oxide-Metal (MOM) capacitors. MOM capacitors can utilize the routing/power/ground metals, but known MOM capacitors also increase the die area.

Conventional MOM capacitors may be formed using CMOS fabrication processes. Electrodes may comprise a plurality of conductive electrode layers formed on a substrate, and the capacitance of a conventional MOM capacitor may be based on the capacitance of a pair of adjacent electrodes comprising capacitances between each metal layer of a pair of adjacent electrodes. Additional capacitances may be similarly formed between two contact metal portions of adjacent electrodes. To further increase the capacitance of conventional MOM capacitors, additional electrodes may be added. However, the surface area of conventional MOM capacitors can be constrained by the design rules associated with the CMOS fabrication process, which can prevent conventional MOM capacitors from achieving certain capacitances without undesirable increase in surface area.

A nanosheet transistor refers to a type of field-effect transistor (FET) that includes a plurality of stacked nanosheets extending between a pair of source/drain epitaxial (EPI) regions formed on an active region which may include an oxide layer or oxide diffusion (OD). The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section.

Epitaxy is a type of material deposition where crystalline layers are formed with a defined orientation with respect to the crystalline substrate. FETs typically include doped source/drain epitaxial regions that are formed in a semiconductor substrate and separated by a channel region. A gate insulation layer is positioned above the channel region and a conductive gate electrode is positioned above the gate insulation layer. The source/drain EPI regions may be doped with N-type dopants and/or P-type dopants. For example, the an N-type Epitaxy (N-EPI) may be provided for forming source/drain regions for an N-type FET, while a P-type EPI (P-EPI) may be provided for forming source/drain regions for a P-type FET. The gate electrode is typically formed by a conductive material such as polysilicon (PO). The gate insulation layer and the gate electrode together may be referred to as the "gate stack," "gate structure," etc., for the device. By applying an appropriate voltage to the gate electrode, the channel region becomes conductive and current is allowed to flow between source regions and drain regions of the structure.

To improve the operating speed of the FETs, and to increase the density of FETs on an integrated circuit (IC), designs have gradually become smaller in size. Reductions to the size and the channel length in FETs can improve the switching speed of the FETs. Device architectures such as "gate-all-around" (GAA) nanosheet structures allow further scaling of ICs, in part because the gate is structured to wrap around the channel. This structure can provide better control with lower leakage current, faster operations, and lower output resistance.

A nanosheet FET thus includes multiple channel layers, each channel layer being separated by a gate stack including a layer of electrically conductive gate material and a gate dielectric layer. The gate stacks wrap around all sides of the channel layers, thereby forming the GAA structure. EPI regions on the ends of the nanosheet channel layers form source/drain regions of the nanosheet FETs. Spacers are employed for electrically isolating the gates from the source/drain regions of nanosheet transistors. Nanosheet transistor spacers may include two portions, namely an outer spacer and an inner spacer.

Aspects herein provide a capacitor in a nanosheet process. In some examples, nanosheet FET structures are provided without N-EPI or P-EPI on the OD. In nanosheet processes, when there is no N-EPI or P-EPI filled in the Source/Drain (S/D) area of the nanosheet FET structure, a Metal Diffusion (MD) depth may deeper (e.g. two or more times the MD depth on Shallow Trench Isolation (STI)). Aspects herein provide a design scheme that leverages some of these nanosheet processes. The aspects can provide a low or zero leakage vertical MD-polysilicon (PO) capacitor in the nanosheet structure, and can include both MD-PO on STI capacitors and MD-PO capacitors when there is no N-EPI or P-EPI on OD. These disclosed capacitors types are referred to as VMOM on nanosheet OD without EPI (VMOM on OD).

An example of the VMOM on OD capacitor has capacitor plates formed by the MD and the PO of the gate electrodes, with the oxide of the OD between the plates to form the capacitor dielectric ("MD-PO capacitor"). The VMOM on the OD can be without N-EPI or P-EPI, as noted above. Further, the VMOM on the OD capacitor can coexist with a VMOM on an STI as discussed further below. The VMOM on OD capacitor can be connected to the MD on the OD, which may be between 2 nm and 200 nm in length. The MD-PO capacitor can be connected to the MD on the STI, which can be between 10 nm and 100 nm in length.

The VMOM on OD capacitor(s) can be implemented with logic rules. A double height SOC standard cell can be created to provide the VMOM on OD capacitors. A cell height can be between, for example, 10 nm and 400 nm. The contact poly pitch can be between, for example, 20 nm to 100 nm. The number of ODs may be two or three, for example, with one larger OD between two other ODs. Wide metal P/G widths may be between, for example, 8 nm to 50 nm. Signal metal widths can be between, for example, 4 nm and 30 nm. The VMOM on OD can merge MOM capacitance on top of it. In this configuration, wide metal P/G widths may be between, for example, 8 nm to 50 nm. Signal metal widths can be between, for example, 4 nm and 30 nm. In one transistor boundary, it may include at least 1 M0 except the wide metal for Power/Ground. The number of M0 is not limited. For example, one transistor boundary may include 2, 3, 4, or 5 M0. Further, for example, the logic FIN boundary design rule can be applied on nanosheet, where the nanosheet corresponds to FinFET.

As noted above, this disclosure proposes a design scheme to implement a zero leakage vertical MD-PO capacitor in nanosheet, comprising both MD-PO on STI and MD-PO capacitors where there is no N-EPI or P-EPI on OD. In nanosheet process, when there is no N-EPI and P-EPI filled in S/D area, the MD depth can be 2 times or more than MD depth on STI. In general, the nanosheet units can have EPI therebetween, and each EPI can have a MD disposed thereon.

The VMOM on OD inclusion in the semiconductor has advantages. The VMOM on OD capacitor(s) can boost zero leakage MD-PO capacitance density. In some configurations, the capacitance density may be boosted 1% to over 100%. No extra masks are required so that the cost may be reduced. Further, there can be a decrease in the die area. Further, there can be low leakage and high capacitance density.

FIGS. 1-7 illustrate various plan and cross-sectional views of a semiconductor device 100, 200 formed as a nanosheet semiconductor structure, which may act as a SOC, in accordance with aspects of the present disclosure. An implementation of a semiconductor device 100 may be as shown in FIGS. 1A and 1B. The cross-sectional view of FIG. 1B is taken generally along line 204 in FIGS. 1B and 2. The semiconductor device 100 can include a capacitor represented by symbols 102a and 102b (collectively capacitor 102). A capacitor 102 can be any device that can store electrical charge in an electric field. Capacitors 102 are passive electronic components, which may be formed by two terminals separated by a space. In many implementations, the space is filled with a dielectric medium while the terminals are formed from conductors.

The semiconductor device 100 can have nanosheet semiconductor device 200. The nanosheet semiconductor structure 100 can include two nanosheet units 122a, 122b (collectively nanosheet unit 122) with source S and drain D regions. The nanosheet unit 122 can comprise one or more nanosheet structures 124a-124f (collectively nanosheet structure 124) and gate contacts such as PO gates 110a, 110b (collectively PO gate 110, PO region 110, or simply PO 110). Typically, the nanosheet units 122a, 122b would have EPI between them, which could be N-EPI or P-EPI. In the illustrated structure, the nanosheet units 122a, 122b have an OD 108 without EPI therebetween. The capacitor 102 provided in semiconductor device 100 may be formed as a VMOM capacitor. As shown in FIG. 1A, conductive contact such as an MD 104 is disposed in or on the OD 108 and a first capacitor terminal may be formed from the MD 104, and a second capacitor terminal may be formed from a region of PO gate 110, where the PO gate 110 refers to the polysilicon gate area. The MD 104 and PO gate 110 are separated by a region of the OD 108, which can act as a dielectric.

The MD 104 may be formed on and/or in the OD 108. The MD 104 can be made from various metals, for example, palladium, platinum, rhodium, iridium, etc. The MD 104 may be deposited on and/or in the OD 108. For example, the MD 104 may have a first portion 116, which is above the OD 108, and a second portion 114, which is formed within the OD 108. The separation of the two portions 114, 116 may be represented by line 118. This implementation of the MD 104 can place the MD 104 within physical proximity of the PO gate 110 to form the VMOM capacitor 102. In this way, the formation of the MD 104 within the OD 108 forms the VMOM capacitor 102. The distance that the MD 104 is formed into the OD 108 may be represented by measurement of a first depth 112, as shown in FIG. 1A. The MD 104 can have various shapes, for example, the MD 104 shown in FIG. 1A can have a wedge like shape, with the two sides having a slight angle from vertical and the top being slightly wider than a bottom of the MD 104.

To change the amount of capacitance provided by the VMOM capacitor 102, the length of the MD 104 or the OD 108 may be adjusted. In implementations, the MD 104 can be between 2 nm and 20 nm in length. The configuration of the MD 104, OD 108, and PO gate 110 provides for a zero leakage capacitor.

The PO gate 110 can be a region comprising the PO gate 110 (also referred to as the PO region or simply as the PO) that surrounds and is connected to the source and drain regions 106. The PO region 110 can be highly-doped areas of silicon that can form the gate connections. The PO gate 110 may be connected to place the capacitor 102 into a circuit. Thus, the PO gate 110 represents the second terminal for the capacitor 102.

The OD 108 can be an oxide structure having dielectric properties. The OD 108 can be formed from silicon oxide or similar compound. The OD 108 can have various depths and/or lengths to provide the dielectric for the capacitor 102 and to change the amount of capacitance provided by the capacitor 102. The insulation material of the OD 108 may be formed of a dielectric of silicon oxide based materials, for example, undoped silicate glass (USG), fluorinated silicate glass (FSG), Plasma-Enhanced CVD (PECVD) silicon oxide, and oxide/nitride/oxide. Further, the insulation material of the OD 108 may be formed of one or more high-k (high dielectric constant) materials, for example, having a dielectric constant of at least 8, e.g., $Ta_2O_5$, $HfO_2$, $SrTiO_3$, $PbTiO_3$, $KNO_3$, and/or $Al_2O_3$.

As shown in FIG. 1A, the ODs without EPI 108 are separated by STIs 138. In some examples, additional VMOM capacitors 132a, 132b (collectively capacitors 132) are formed on the STI's 138. These structures are referred to herein as VMOM on STI capacitors 132.

Figure 1B:
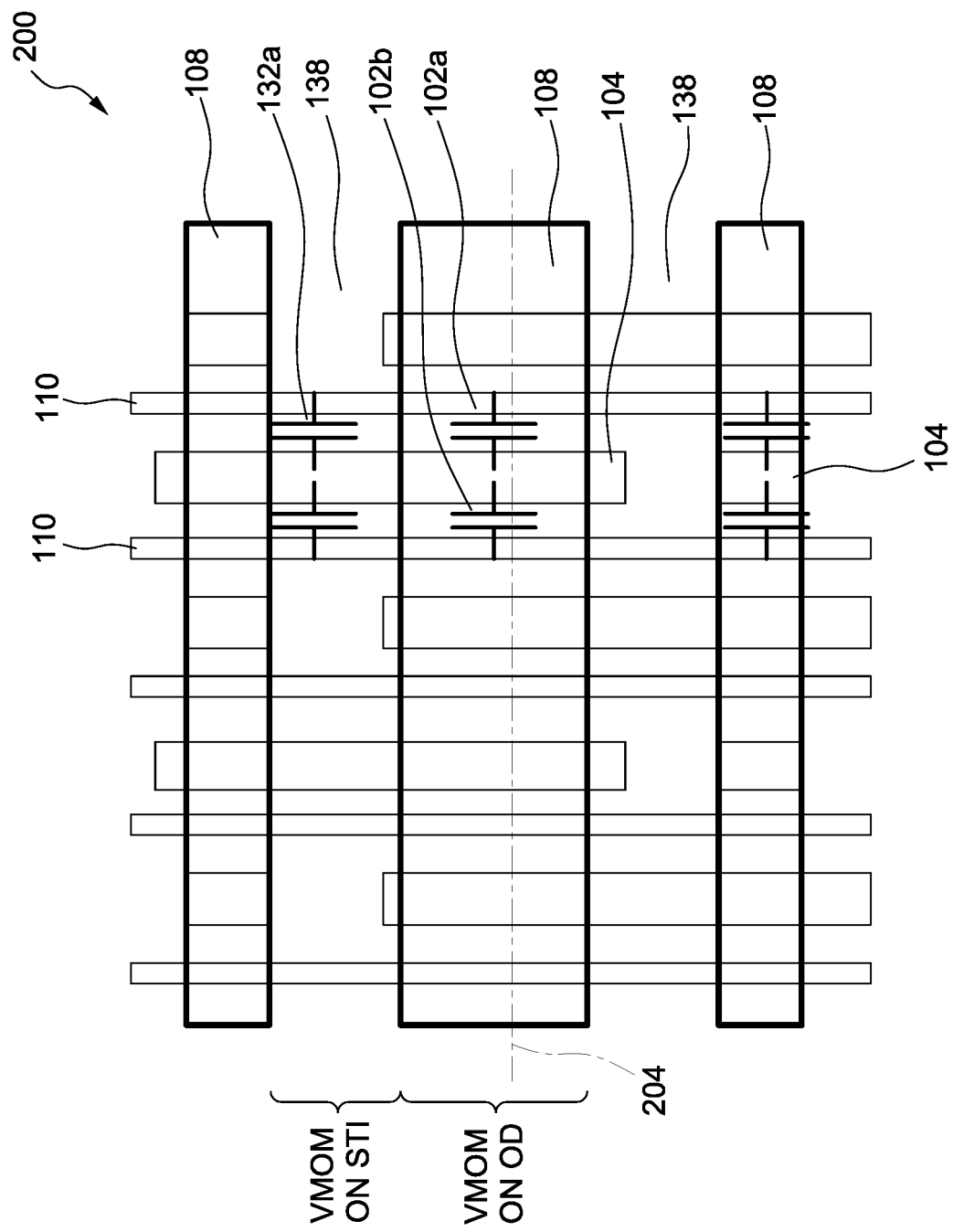
FIG. 1B is a top view block diagram illustrating further aspects of the example semiconductor device shown in FIG. 1A in accordance with examples of the present application.
Figure 1C:
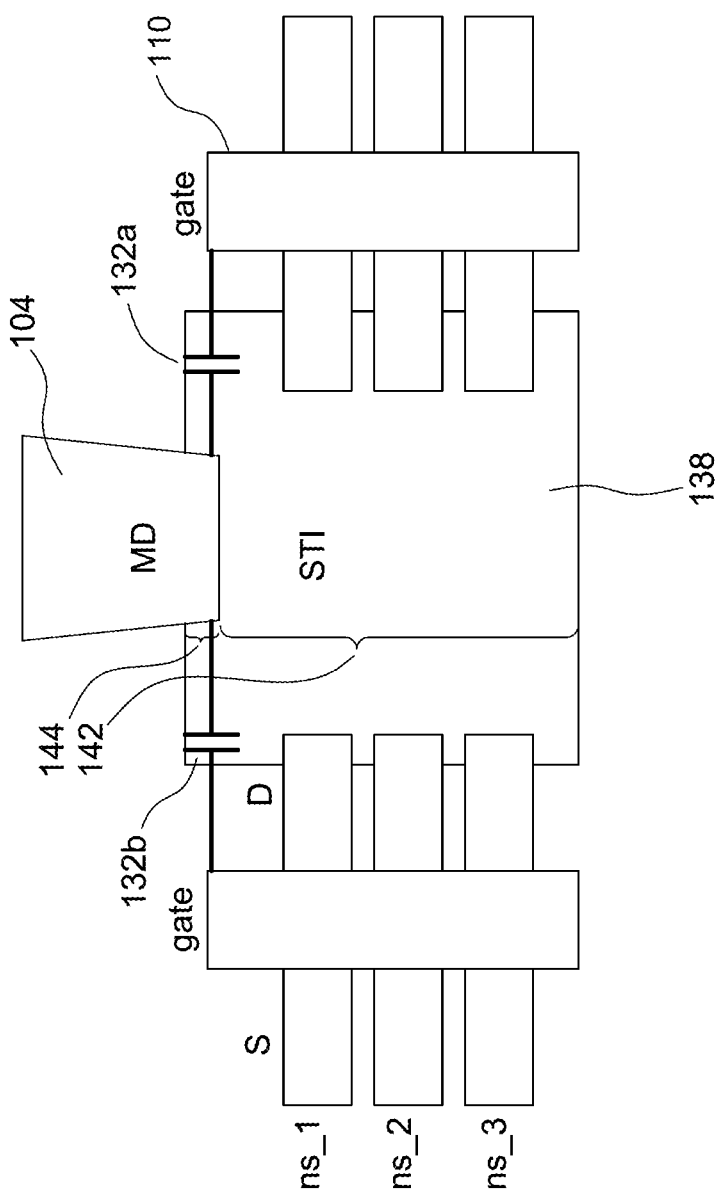
FIG. 1C is a section view block diagram illustrating further aspects of the example semiconductor device shown in FIG. 1B in accordance with examples of the present application.

An implementation of the VMOM on STI capacitor 132 may be as shown in FIG. 1C. In this implementation, the VMOM on STI capacitor 132 is formed between the MD 104 and the PO 110. The capacitor 132 is formed with an area of STI 138 separating the MD 104 and the PO 110. The capacitor 132 may be included with the capacitor 102 shown in FIG. 1A. As such, both types of capacitors 102, 132 may exist within a nanosheet structure as shown in FIG. 1B.

Referring FIGS. 1A and 1C, the distance that the MD 104 is formed into the OD 108 may be represented by measurement of a first depth 112, as shown in FIG. 1A. The MD 104 formed in/on the OD 108 can be two or more times as deep as the MD 104 formed in the STI 138, as represented by measurement 144 as shown in FIG. 1C. Further, the MD 104 may be nearer a bottom portion of the OD 108, as represented by depth measurement 120, as contrasted with the depth measurement 142, shown in FIG. 1C, representing the depth of the MD 104 in the STI 138.

In some implementations, the first depth 112, of the MD 104 in the OD 108, may be two or more times the second depth 144 of the MD 104 in the STI 138. Overall, the depth or height of the MD 104 can be two or more times the depth or height of the MD 104. The MD 104 can have various shapes, for example, the MD 104 shown in FIGS. 1A and 1C can have a wedge like shape, with the two sides having a slight angle from vertical and the top being slightly wider than a bottom of the MD 104.

Figure 2:
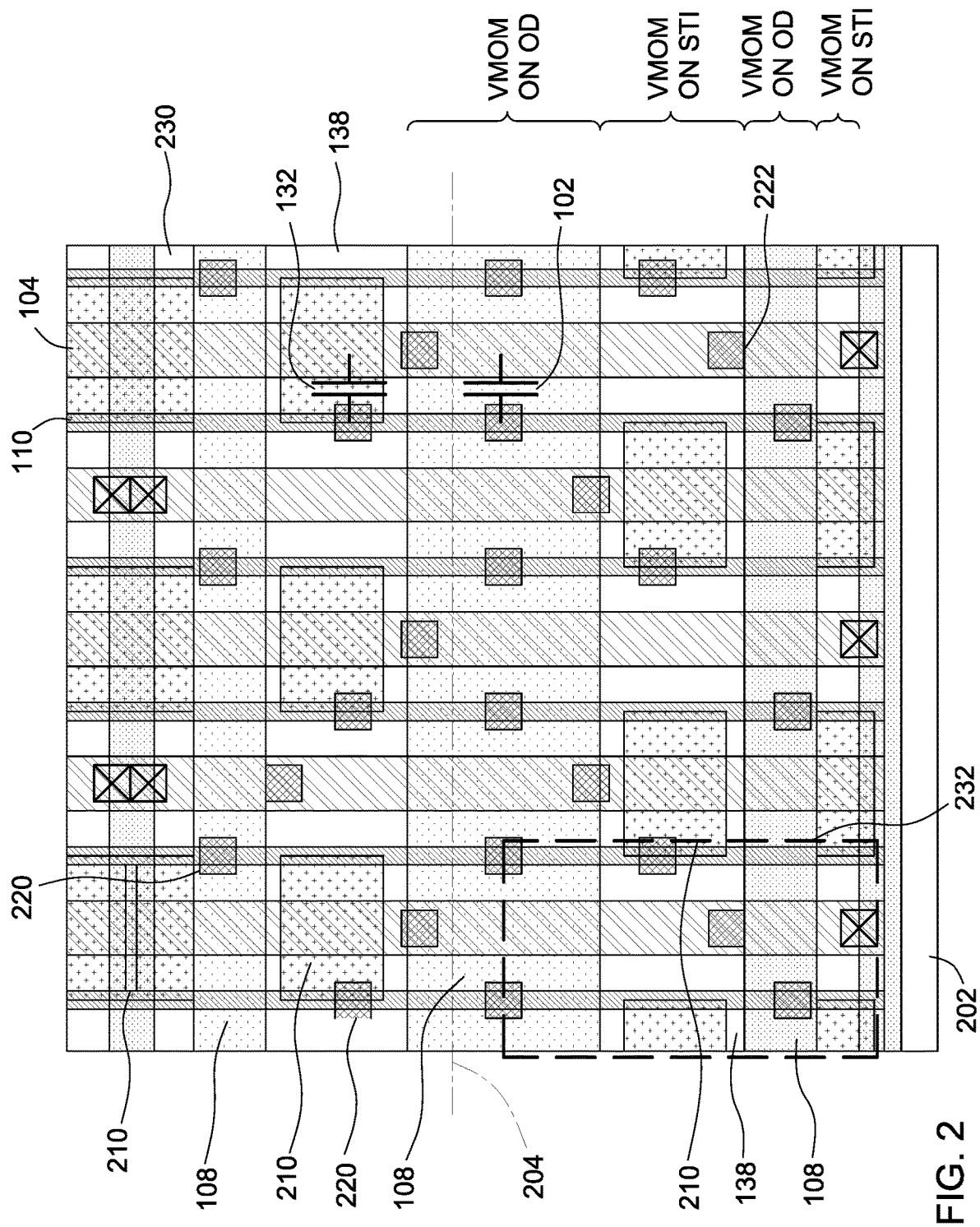
FIG. 2 is a top view illustrating further aspects of the example semiconductor device shown in FIGS. 1A-1C in accordance with examples of the present application.

FIG. 2 illustrates further aspects of the nanosheet semiconductor device 200 shown in FIG. 1B. The nanosheet semiconductor device 200 can include a substrate 202, which can include one or more of, but is not limited to, bulk silicon, a semiconductor wafer, a silicon-on-insulator (SOI) substrate, or a silicon germanium substrate. Other semiconductor materials may include group III, group IV, and group V elements are used in some implementations. The substrate 202 is the supporting material upon which the semiconductor device 200 is formed. The substrate 202 can include various materials that support film circuit elements and possibly other components.

The illustrated device 200 includes two VMOM on OD regions having the capacitors 102 shown in FIG. 1A and two MOM on STI regions having the capacitors 132 shown in FIG. 1C. Thus, the device 200 includes ODs 108 without EPI that are separated by STIs 138. The POs 110 and MDs 104 extend vertically in the example of FIG. 2, with the cut MDs 210 configured to physically and electrically separate portions of the MDs 104. Gate vias (VG) 220 and MD vias (VD) 222 provide respective electrical connections to the PO 110 and MDs 104.

Figure 3:
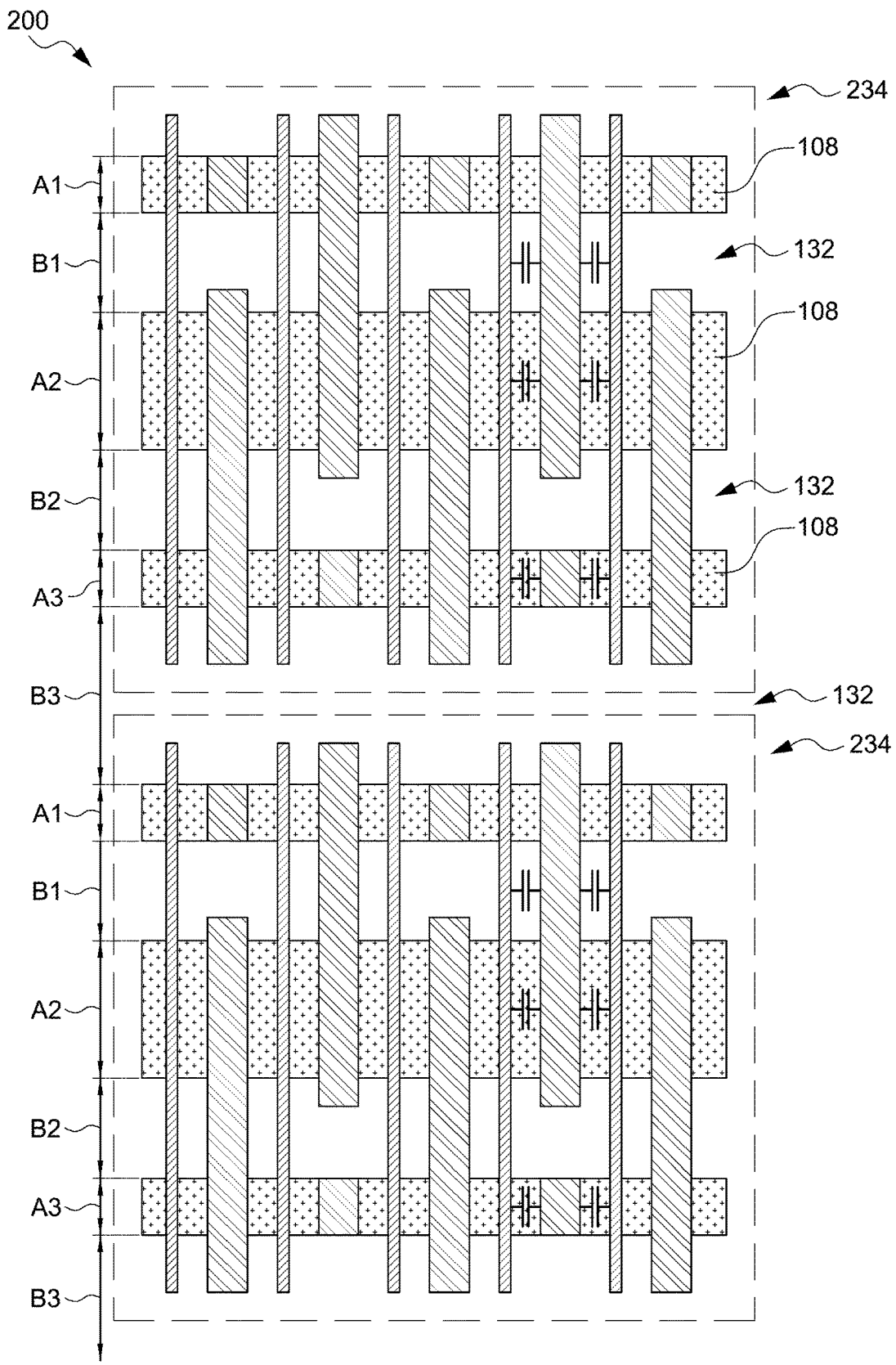
FIG. 3 is a top view illustrating further aspects of the example semiconductor device shown in FIGS. 1A-1C in accordance with examples of the present application.

FIG. 3 illustrates an example of the semiconductor device 200 that includes a plurality of the ODs 108 without EPI, which are separated from one another by STIs 132. As noted above, the depth of the MD 104 into the OD 108 may be greater than the depth of MD 104 into the STI 138. For instance, the MD 104 in the OD 108, may be two or more times the depth of the MD 104 in the STI 138. In the example of FIG. 3, MD 104 length (i.e. depth) on the OD in the OD regions A1, A2 and A3 is between 2 nm and 200 nm. MD 104 length (i.e. depth) on the STI in the STI regions B1, B2 and B3 is between 10 nm and 100 nm.

Examples of the semiconductor device 200 disclosed herein may be implemented using design rules. ICs are often designed using highly automated processes known as electronic design automation (EDA). Such EDA tools and methods facilitate the design, partition, and placement of microelectronic integrated circuits on a semiconductor substrate. This process typically includes turning a behavioral description of the circuit into a functional description, which is then decomposed into logic functions and mapped into cells using a standard cell library. The standard cell library contains a listing of pre-designed components, or cells, each of which may perform a discrete logic function. The cells are stored in the cell library as information comprising internal circuit elements, the various connections to these circuit elements, a pre-designed physical layout pattern that includes the unit height of each cell along with the cell's designed power rails, dopant implants, wells, etc. Additionally, the stored cell may also comprise a shape of the cell, terminal positions for external connections, delay characteristics, power consumption, etc.

Standard cell logic design rules may be used in the design of the cells stored in the standard cell library. For example, FinFET logic design rules may be applied to the nanosheet structures, where the nanosheet corresponds to FinFET structures. Such logic design rules may include, for example, spacing criteria between vias such as the VGs 220 and VDs 222 shown in FIG. 2. In some embodiments, the logic design rules include pitch spacing criteria between nanosheet layout patterns of layout designs, spacing criteria between via layout patterns and cut feature layout patterns, spacing criteria between OD regions, MD design rules, metal zero (M0) track design rules, etc.

Referring back to FIG. 2, the illustrated semiconductor device 200 may be implemented as a double height, system-on-a-chip (SOC) standard cell 230, which includes one or more single light logic cells 232. The example of FIG. 3 may include two standard cells 234 indicated by the broken line.

Figure 4A:
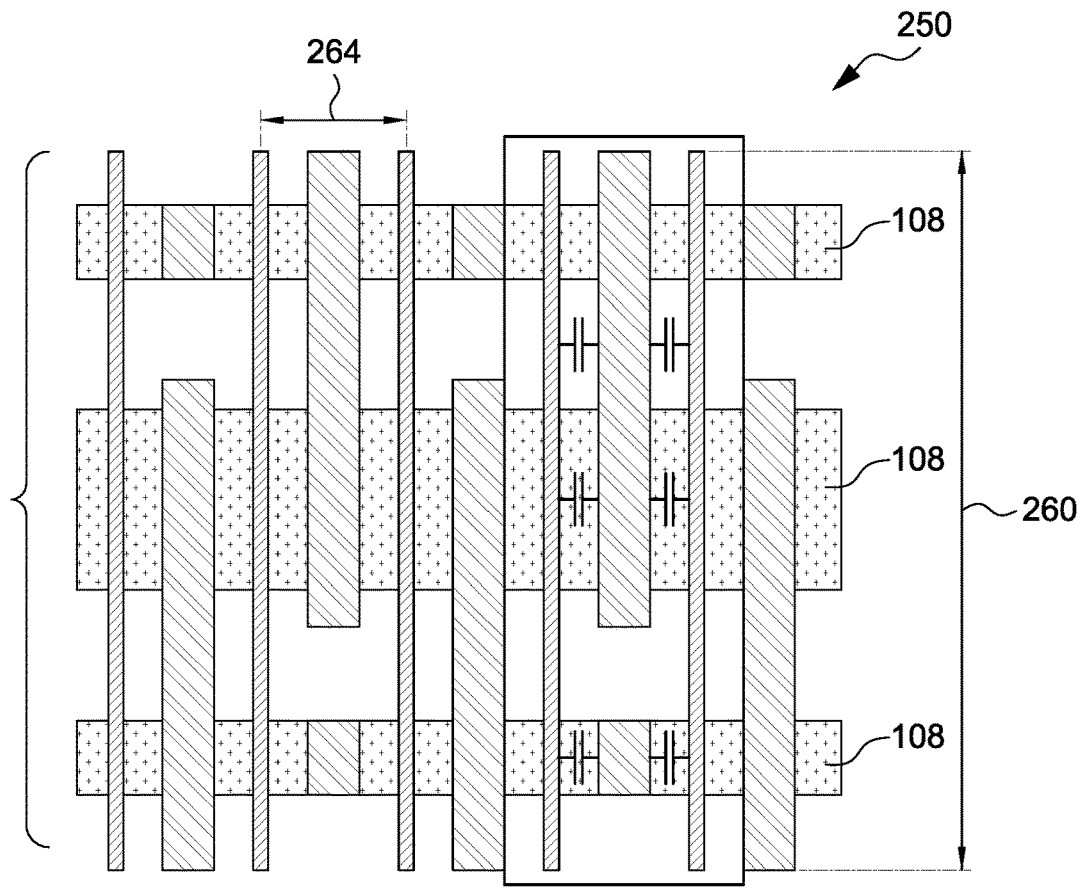
FIGS. 4A and 4B are top views illustrating further aspects of the example semiconductor device shown in FIGS. 1A-1C in accordance with examples of the present application.
Figure 4B:
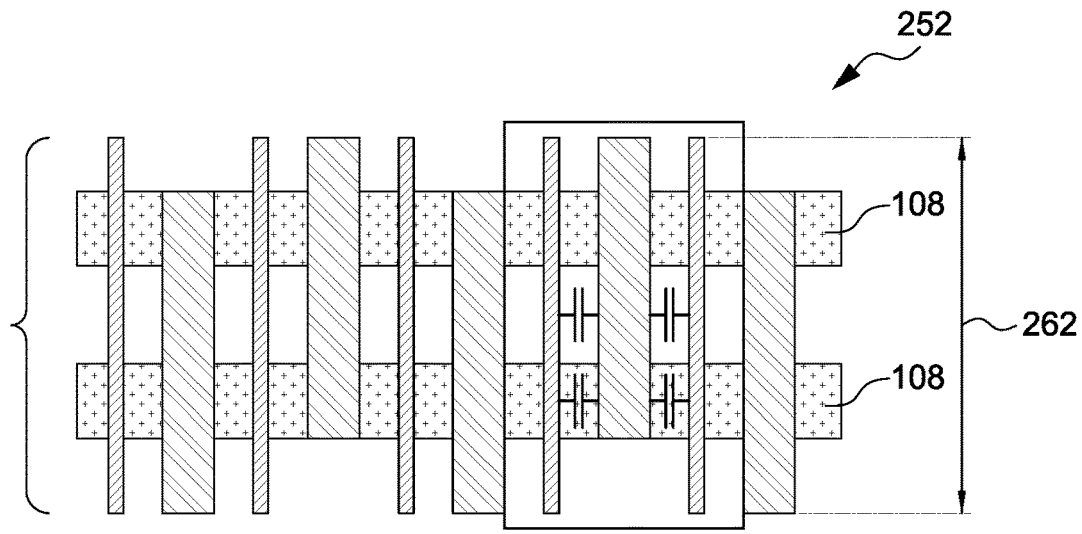

FIGS. 4A and 4B illustrate examples of various logic design rule ranges that may be used in the design and manufacture of the semiconductor device as a standard cell. FIG. 4A illustrates aspects of an example standard cell 250 that includes three ODs 108, and FIG. 4B illustrates another standard cell 252 that includes two ODs 108. Logic design rules applied to the standard cells 250, 252 may include the number of ODs 108. Further, the logic design rules may define relative sizes of the ODs 108. For instance, the standard cell 250 shown in FIG. 4A as one large OD 108 position between two smaller ODs 108. Other logic design rules may define cell heights for the standard cells 250, 252. For example, in some embodiments logic design rules may define cell height 260, 262 of the respective standard cells 250, 252 as between 10 nm to 400 nm. Other logic design rules may define contact poly pitch (CPP) 264 as between 20 nm to 100 nm.

Figure 5:
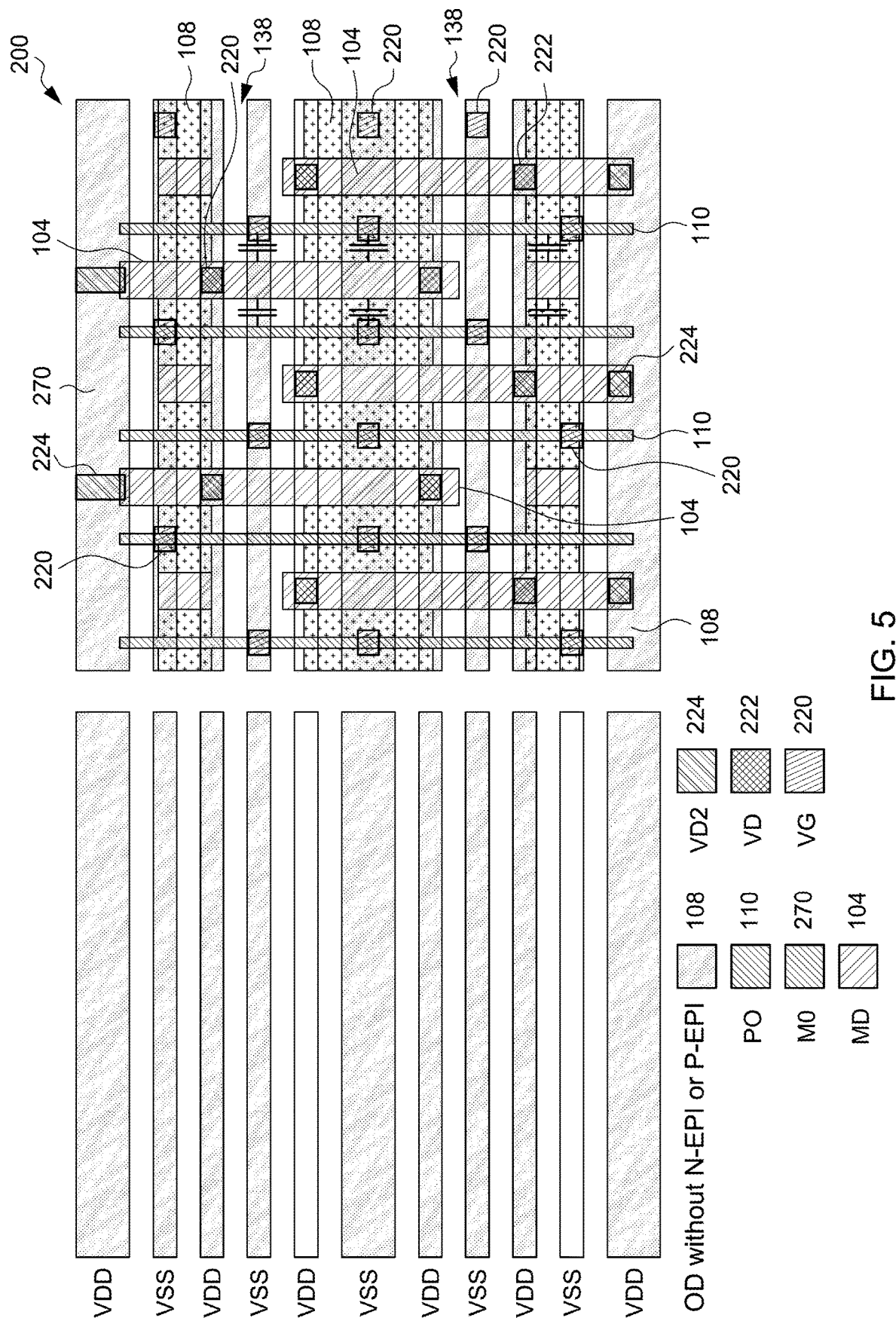
FIG. 5 is a top view illustrating further aspects of the example semiconductor device shown in FIG. 2 in accordance with examples of the present application.

FIG. 5 illustrates examples of further design rules that may be applied for the semiconductor device 200. The semiconductor device 200 shown in FIG. 5 includes a plurality of metal layer 0 (M0) conductors shown separated from the semiconductor device 200 for clarity. The nanosheet semiconductor device 200 includes the substrate 202, which can include one or more of, but is not limited to, bulk silicon, a semiconductor wafer, a silicon-on-insulator (SOI) substrate, or a silicon germanium substrate. The illustrated device 200 includes OD regions 108 having the capacitors 102 shown in FIG. 1A and STIs 138 having the capacitors 132 shown in FIG. 1C. As discussed above, the device 200 thus includes ODs 108 without EPI that are separated by STIs 138. In addition to the VGs 220 and VDs 222, the example shown in FIG. 5 includes vias (VD2) 224 connecting the M0 conductors as illustrated.

The logic design rules may define widths for the M0 metal tracks. For instance, as shown in FIG. 5, power/ground M0 tracts may have a width of 8 nm-50 nm. Other M0 tracks, such as signal metal tracks may have a width of 4 nm-30 nm. The number of M0 tracks is not limited.

Figure 6:
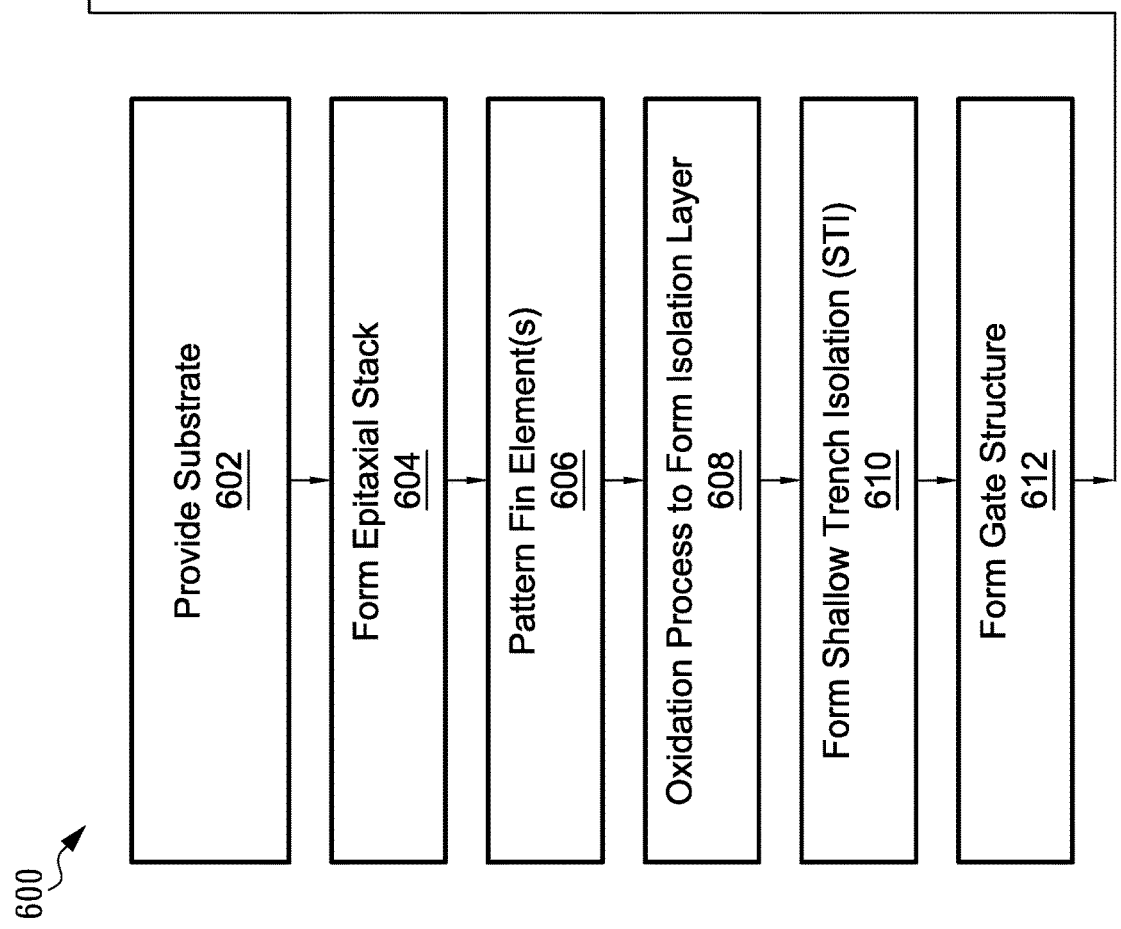
FIG. 6 is a process diagram showing a process for forming the device(s) as described herein in accordance with examples of the present application.

A method 600 of semiconductor fabrication is shown in FIG. 6. FIGS. 7A-7H are views of a semiconductor device 100 according to various stages of the method 600 of FIG. 6. As with the other method implementations and exemplary devices discussed herein, it is understood that parts of the semiconductor device 100 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some implementations, the exemplary devices include a plurality of semiconductor devices (e.g., transistors), including PFETs, NFETs, etc., which may be interconnected. Moreover, it is noted that the process steps of method 600, including any descriptions given with reference to FIGS. 7A-7H, as with the remainder of the method and exemplary figures provided in this disclosure, are merely exemplary and are not intended to be limiting.

In stage 602, a substrate is provided. Referring to the example of FIG. 7A, a substrate 202 is provided. In some implementations, the substrate 202 may be a semiconductor substrate such as a silicon substrate. The substrate 202 may include various layers, including conductive or insulating layers formed on a semiconductor substrate. The substrate 202 may include various doping configurations depending on design requirements. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 typically has isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

An anti-punch through (APT) implant may also be performed, in stage 602. The APT implant may be performed in a region underlying the channel region of a device, for example, to prevent punch-through or unwanted diffusion. In some implementations, a first photolithography (photo) step is performed to pattern a P-type APT region and a second photo step is performed to pattern an N-type APT region. For example, performing the first photo step may include forming a photoresist layer (resist) over the substrate 202, exposing the resist to a pattern (e.g., P-type APT implant mask), performing post-exposure bake processes, and developing the resist to form a patterned resist layer. By way of example, a P-type dopant implanted via the ion implantation process to form the P-type APT region may include boron, aluminum, gallium, indium, or other P-type acceptor material. Thereafter, the second photo step may be performed, where the second photo step may include forming a resist layer over the substrate 202, exposing the resist to a pattern (e.g., N-type APT implant mask), performing post-exposure bake processes, and developing the resist to form a patterned resist layer. By way of example, an N-type dopant implanted via the ion implantation process into the N-type APT region may include arsenic, phosphorous, antimony, or other N-type donor material. Additionally, in various implementations, an APT implant may have a high dopant concentration, for example, of between about $1\times10^{18}$ $cm^{-3}$ and $1\times10^{19}$ $cm^{-3}$. In some implementations, such a high APT dopant concentration may be advantageously used, as described below, because of the presence of a subsequently formed isolation layer over the APT-implanted substrate, which can serve as a dopant diffusion barrier.

One or more epitaxial layers may then be grown on the substrate 202, in stage 604. In an implementation of stage 604, an epitaxial stack 702 is formed over the APT-implanted substrate 202. The epitaxial stack 702 includes epitaxial layers 704 of a first composition interposed by epitaxial layers 706 of a second composition. The first and second composition can be different. In an implementation, the epitaxial layers 704 are SiGe and the epitaxial layers 706 are silicon. However, other implementations are possible including those that provide for a first composition and a second composition having different oxidation rates. For example, in various implementations, the epitaxial layer 704 has a first oxidation rate, and the epitaxial layer 706 has a second oxidation rate less than the first oxidation rate. In some implementations, the epitaxial layer 704 includes SiGe and where the epitaxial layer 706 includes Si, the Si oxidation rate of the epitaxial layer 706 is less than the SiGe oxidation rate of the epitaxial layer 704. During a subsequent oxidation process, as discussed below, the portions the epitaxial layer 704 may be fully oxidized, while only the epitaxial layer 706 may be non-oxidized, or in some implementations oxidized only slightly.

It is noted that the bottom-most epitaxial layer is denoted 704a for ease of reference in later process steps. In implementations however, epitaxial layer 704a is substantially similar material to the epitaxial layers 704b formed over the epitaxial layer 704a. In an implementation, the epitaxial layer 704a is SiGe and the epitaxial layers 704b may also be SiGe. In other implementations, the epitaxial layer 704a has a different composition than epitaxial layers 704b and/or epitaxial layers 706a-706c. The thickness of the epitaxial layer 704a may be greater than that of the overlying epitaxial layers 704b-704c.

The epitaxial layers 706a-706c or portions thereof may form a channel region of the device 100. For example, the epitaxial layers 706a-706c may be referred to as "nanowires" used to form a channel region of a multi-gate device 100 such as a GAA device. These "nanowires" are also used to form portions of the source/drain features of the multi-gate device 100, as discussed below. Again, as the term is used herein, "nanowires" refers to semiconductor layers that are cylindrical in shape as well as other configurations such as, bar-shaped. The use of the epitaxial layers 706a-706c to define a channel or channels of a device is further discussed below.

It is noted that three (3) layers of each of epitaxial layers 704 (including 704a-704c) and 706 are illustrated in FIG. 7A, this is for illustrative purposes only and not intended to be limiting beyond what is specifically recited in the claims. It can be appreciated that any number of epitaxial layers can be formed in the epitaxial stack 702; the number of layers depending on the desired number of channels regions for the device 100. In some implementations, the number of epitaxial layers 704 is between 2 and 10.

In some implementations, the epitaxial layer 704 has a thickness range of about 2-6 nanometers (nm). The epitaxial layers 704b-704c (provided above the layer 704a) may be substantially uniform in thickness. In some implementations, the epitaxial layer 704a has a thickness of approximately 8 to 15 nm. In some implementations, the epitaxial layers 706 has a thickness range of about 6-12 nm. In some implementations, the epitaxial layers 706 of the stack are substantially uniform in thickness. As described in more detail below, the epitaxial layers 706 may serve as channel region(s) for a subsequently-formed multi-gate device and its thickness chosen based on device performance considerations. The epitaxial layer 704 may serve to define a gap distance between adjacent channel region(s) for a subsequently-formed multi-gate device and its thickness chosen based on device performance considerations.

By way of example, epitaxial growth of the layers of the stack 702 may be performed by a molecular beam epitaxy (MBE) process, a metalorganic chemical vapor deposition (MOCVD) process, and/or other suitable epitaxial growth processes. In some implementations, the epitaxially grown layers such as, the layers 706 include the same material as the substrate 202. In some implementations, the epitaxially grown layers 704, 706 include a different material than the substrate 202. As stated above, in at least some examples, the epitaxial layer 704 includes an epitaxially grown silicon germanium (SiGe) layer and the epitaxial layer 706 includes an epitaxially grown silicon (Si) layer. In some implementations, epitaxial layer 704a is also SiGe. Alternatively, in some implementations, either of the epitaxial layers 704, 706 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 704, 706 may be chosen based on providing differing oxidation, etch selectivity properties. In various implementations, the epitaxial layers 704, 706 are substantially dopant-free (i.e., having an extrinsic dopant concentration from 0 cm$^{-3}$ to about 1×10$^{17}$ cm$^{-3}$, where for example, no intentional doping is performed during the epitaxial growth process).

As also shown in the example of FIG. 7A, a hard mask (HM) layer 704*d* may be formed over the epitaxial stack 702. In some implementations, the HM layer 704*d* includes an oxide layer (e.g., a pad oxide layer that may include SiO$_2$) and nitride layer (e.g., a pad nitride layer that may include Si$_3$N$_4$) formed over the oxide layer. In some examples, the HM layer 704*d* includes thermally grown oxide, CVD-deposited oxide, and/or ALD-deposited oxide. In some implementations, the HM layer 704*d* includes a nitride layer deposited by CVD or other suitable technique. The HM layer 704*d* may be used to protect portions of the substrate 202 and/or epitaxial stack 702 and/or used to define a pattern (e.g., fin elements).

In stage 606, fin elements are patterned and formed. With reference to the example of FIG. 7B, a plurality of fin elements 708*a*-708*b*, extending from the substrate 202 are formed. In various implementations, each of the fin elements 708 includes a substrate portion formed from the substrate 202, portions of each of the epitaxial layers of the epitaxial stack 702 including epitaxial layers 704 and 706, and an HM layer portion from the HM layer 704*d*.

The fins 708 may be fabricated using suitable processes including photolithography and etch processes. The photolithography process may include forming a photoresist layer over the substrate 202 (e.g., over the HM layer 704*d* of FIG. 7B), exposing the resist to a pattern, performing post-exposure bake processes, and developing the resist to form a masking element including the resist. In some implementations, patterning the resist to form the masking element may be performed using an electron beam (e-beam) lithography process. The masking element may then be used to protect regions of the substrate 202, and layers formed thereupon, while an etch process forms trenches 710 in unprotected regions through the HM layer 704*d*, through the epitaxial stack 702, and into the substrate 202, thereby leaving the plurality of extending fins 708. The trenches 710 may be etched using a dry etch (e.g., reactive ion etching), a wet etch, and/or other suitable processes.

Numerous other implementations of methods to form the fins on the substrate may also be used including, for example, defining the fin region (e.g., by mask or isolation regions) and epitaxially growing the epitaxial stack 702 in the form of the fin 708. In some implementations, forming the fins 708 may include a trim process to decrease the width of the fins 708. The trim process may include wet or dry etching processes.

An oxidation process may be performed to form an isolation region within the fin element(s), in stage 608. In an implementation of stage 608, the device 100 is exposed to an oxidation process that fully oxidizes the epitaxial layer portion 704*a* of each of the plurality of fin elements 708. The epitaxial layer portion 704*a* is transformed into an oxidized layer, which provides an isolation region/layer. In some implementations, the oxidized layer has a thickness range of about 5 to about 25 nanometers (nm). In an implementation, the oxidized layer may include an oxide of silicon germanium (SiGeO$_x$).

The oxidation process of stage 608 may include forming and patterning various masking layers such that the oxidation is controlled to the epitaxial layer 704*a*. In other implementations, the oxidation process is a selective oxidation due to the composition of epitaxial layer 704*a*. In some examples, the oxidation process may be performed by exposing the device 100 to a wet oxidation process, a dry oxidation process, or a combination thereof. In at least some implementations, the device 100 is exposed to a wet oxidation process using water vapor or steam as the oxidant, at a pressure of about 1 ATM, within a temperature range of about 400-600 degrees C., and for a time from about 0.5-2 hours. It is noted that the oxidation process conditions provided herein are merely exemplary and are not meant to be limiting.

As described above, in some implementations, the first epitaxial layer portion 704*a* may include a material having a first oxidation rate, and the second epitaxial layer portion 706 may include a material having a second oxidation rate less than the first oxidation rate. By way of example, in implementations where the first epitaxial layer portion 704*a* includes SiGe, and where the second epitaxial layer portion 706 includes Si, the faster SiGe oxidation rate (i.e., as compared to Si) ensures that the SiGe layer (i.e., the epitaxial layer portion 704*a*) becomes fully oxidized while minimizing or eliminating the oxidization of other epitaxial layers 704. It will be understood that any of the plurality of materials discussed above may be selected for each of the first and second epitaxial layer portions that provide different suitable oxidation rates.

The resultant oxidized layer of each of the fin elements 708 can serve as a diffusion barrier to APT dopants previously implanted into the substrate 202, and which may be present in the substrate 202 directly below the oxidized layer. Thus, in various implementations, the oxidized layer serves to prevent APT dopants within the substrate portion 202 from diffusing for example, into the overlying epitaxial layer(s) 706, which can serve as a channel region for a subsequently formed multi-gate device. In other implementations, the oxidized layer is omitted.

The method 600 then proceeds to stage 610 where shallow trench isolation (STI) features are formed between the fin elements. With reference to the example of FIG. 7C, STI features 712 are disposed between the fins 708. By way of example, in some implementations, a dielectric layer is first deposited over the substrate 202, filling the trenches 710 with the dielectric material. In some implementations, the dielectric layer may include SiO$_2$, silicon nitride, silicon oxynitride, fluorine-doped silicate glass (FSG), a low-k dielectric, combinations thereof, and/or other suitable materials known in the art. In various examples, the dielectric layer may be deposited by a CVD process, a subatmospheric CVD (SACVD) process, a flowable CVD process, an ALD process, a PVD process, and/or other suitable process. In some implementations, after deposition of the dielectric layer, the device 100 may be annealed, for example, to improve the quality of the dielectric layer. In some implementations, the dielectric layer (and subsequently formed STI features 712) may include a multi-layer structure, for example, having one or more liner layers.

Figure 7B:
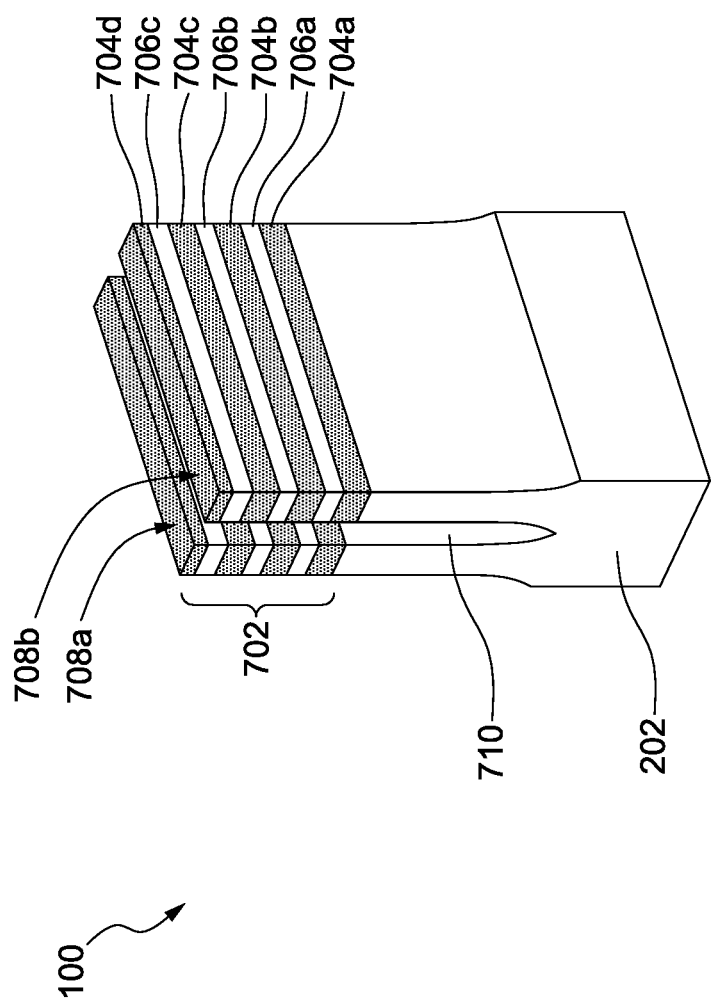
FIG. 7B is another isometric view of the structures formed to form the device(s) as described herein in accordance with examples of the present application.
Figure 7C:
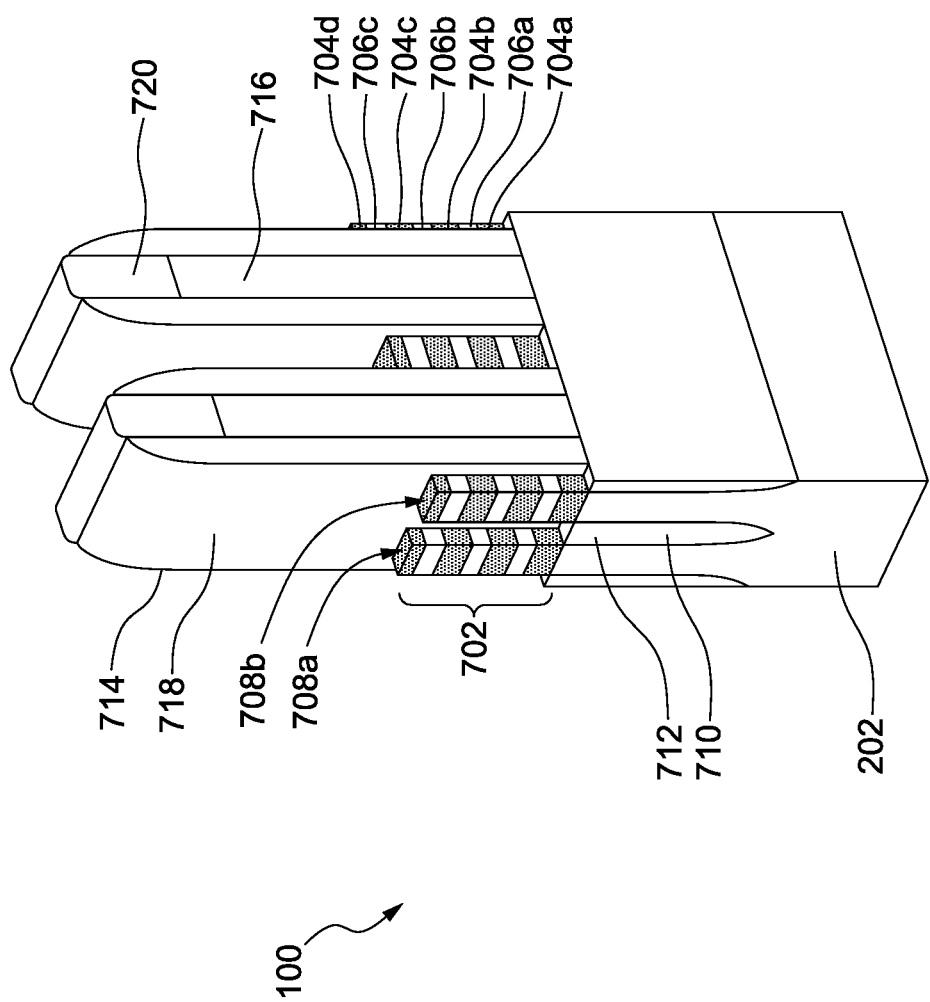
FIG. 7C is another isometric view of the structures formed to form the device(s) as described herein in accordance with examples of the present application.

In forming the STI features, after deposition of the dielectric layer, the deposited dielectric material is thinned and planarized, for example by a chemical mechanical polishing (CMP) process. The CMP process may planarize the top surface thereby forming STI features 712. As illustrated in FIG. 7C, in some implementations, the CMP process used to planarize the top surface of the device 100 and form the STI features 712 may also serve to remove the HM layer 704*d* from each of the plurality of fin elements 708. In some implementations, removal of the HM layer 704*d* may alternately be performed by using a suitable etching process (e.g., dry or wet etching).

The STI features interposing the fin elements are recessed. Referring to the example of FIG. 7C, the STI features 712 are recessed providing the fins 708 extending above the STI features 712. In some implementations, the recessing process may include a dry etching process, a wet etching process, and/or a combination thereof. In some implementations, a recessing depth is controlled (e.g., by controlling an etching time) so as to result in a desired height of the exposed upper portion of the fin elements 708. The height exposes each of the layers of the epitaxy stack 702. The recess of the STI feature 712 may be substantially coplanar with a top surface of the isolation region, in other implementations this may not be required.

In stage 612, sacrificial layers/features may be formed. In some implementations, a dummy dielectric layer and/or a gate structure may be formed. For example, stage 612 may include a dummy oxide deposition followed by a gate structure. While the present discussion is directed to a replacement gate process whereby a gate structure is formed and subsequently replaced, other configurations may be possible.

Referring now to the example of FIG. 7C, in a further implementation of stage 612, fabrication and processing of the gate stack is performed. Using the example of FIG. 7C, a gate stack 714 is formed. The gate stack 714 or portions thereof may be a high-K/metal gate stack. In some implementations, the gate stack 714 is formed over the substrate 202 and is at least partially disposed over the fin elements 708. The portion of the fin elements 708 underlying the gate stack 714 may be referred to as the channel region. The gate stack 714 may also define a source/drain region of the fin elements 708, for example, the regions of the fin and epitaxial stack 702 adjacent and on opposing sides of the channel region.

In some implementations, the gate stack 714 can include one or more of, but is not limited to, a dielectric layer, an electrode layer 716, and a hard mask 720 which may include multiple layers (e.g., an oxide layer and a nitride layer). In some implementations, the dielectric layer is not included in the gate stack 714, for example, being removed prior to the deposition of the gate stack 714. In some implementations, an additional gate dielectric layer is included in the gate stack in addition or in lieu of the dielectric layer. In some implementations, the gate stack 714 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some implementations, the etching process may include dry etching (e.g., RIE etching), wet etching, and/or other etching methods.

As indicated above, the gate stack 714 may include an additional gate dielectric layer. For example, the gate stack 714 may include silicon oxide. Alternatively or additionally, the gate dielectric layer of the gate stack 714 may include silicon nitride, a high-K dielectric material or other suitable material. In some implementations, the electrode layer 716 of the gate stack 714 may include polycrystalline silicon (polysilicon). In some implementations, the hard mask layer 720 includes an oxide layer, for example, a pad oxide layer that may include $SiO_2$. In some implementations, hard mask layer 720 includes the nitride layer such as a pad nitride layer that may include $Si_3N_4$, silicon oxynitride or alternatively include silicon carbide. In some implementations, after formation of the gate 714, the dielectric layer is removed from the exposed regions of the substrate including fins 708 not covered by the gate 714.

Figure 7D:
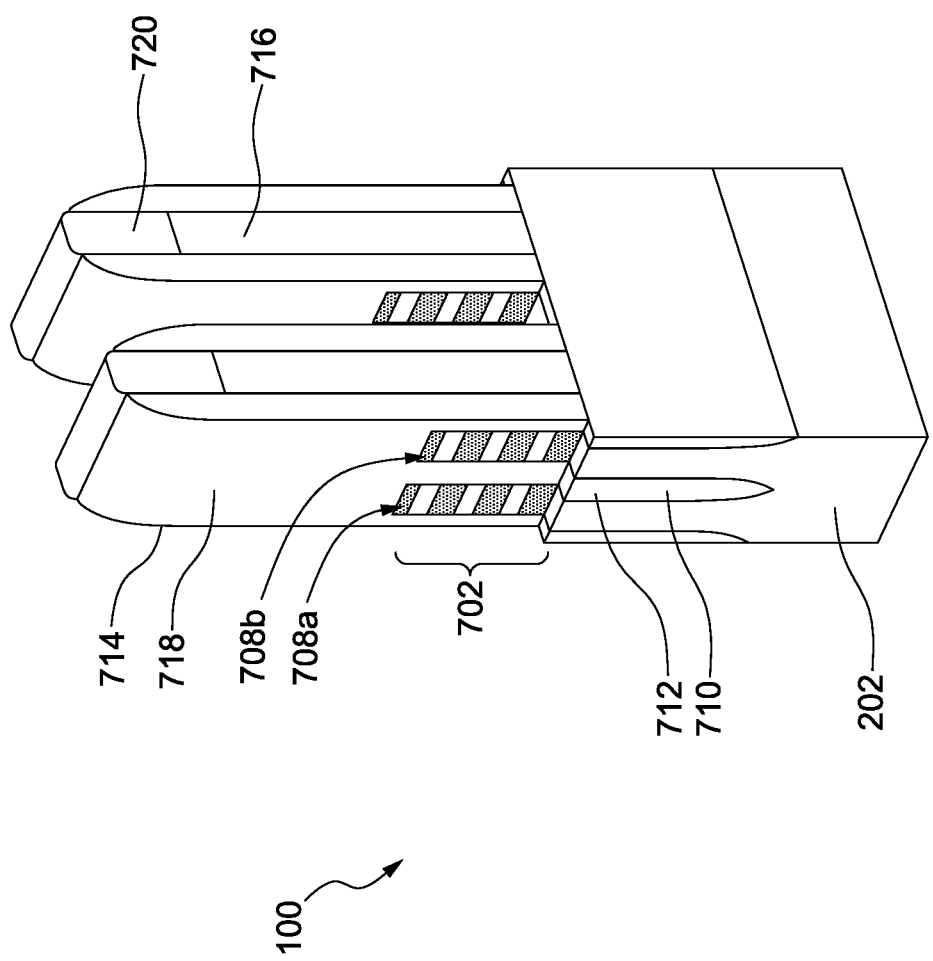
FIG. 7D is another isometric view of the structures formed to form the device(s) as described herein in accordance with examples of the present application.
Figure 7E:
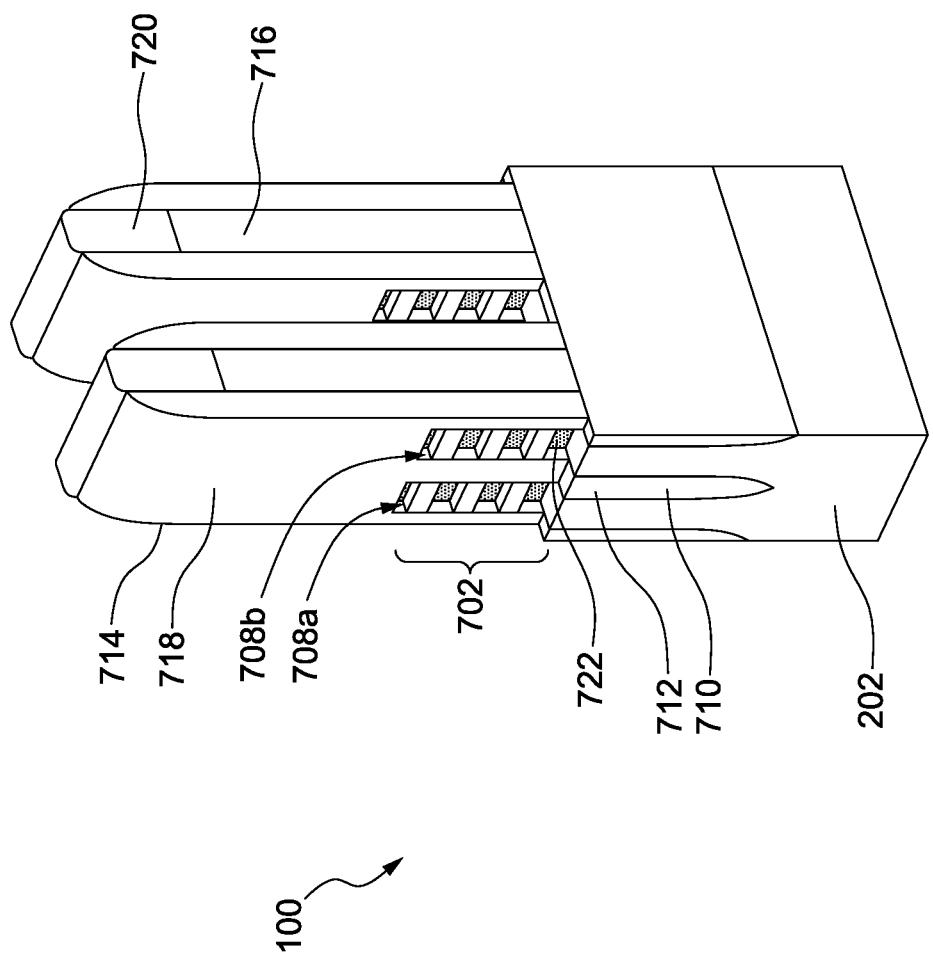
FIG. 7E is another isometric view of the structures formed to form the device(s) as described herein in accordance with examples of the present application.
Figure 7F:
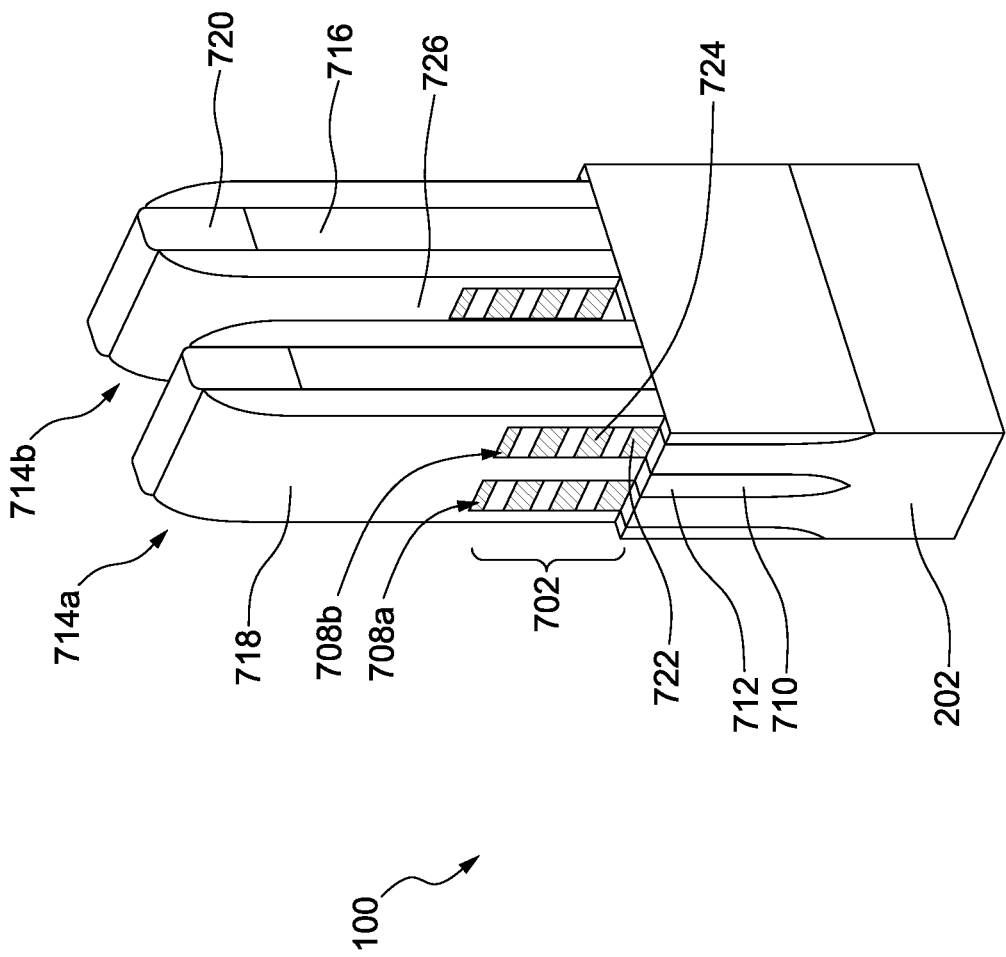
FIG. 7F is another isometric view of the structures formed to form the device(s) as described herein in accordance with examples of the present application.
Figure 7G:
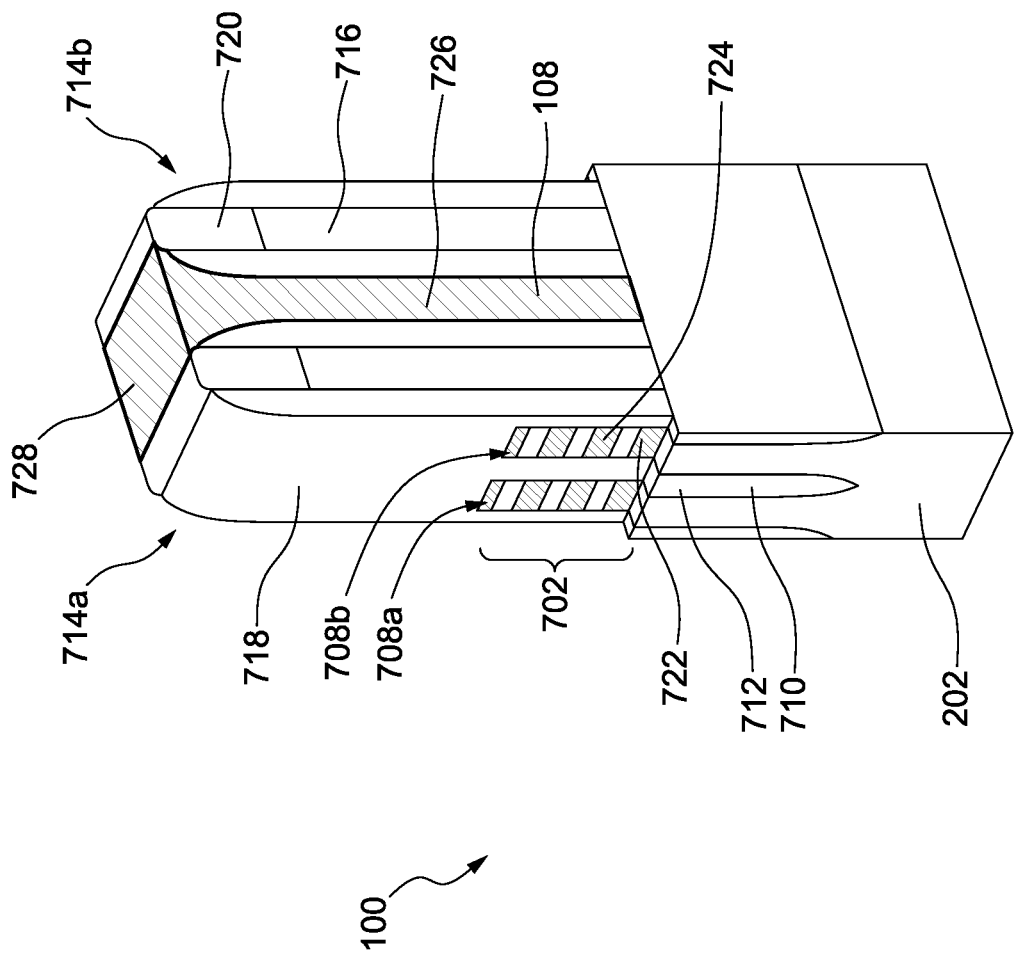
FIG. 7G is another isometric view of the structures formed to form the device(s) as described herein in accordance with examples of the present application.
Figure 7H:
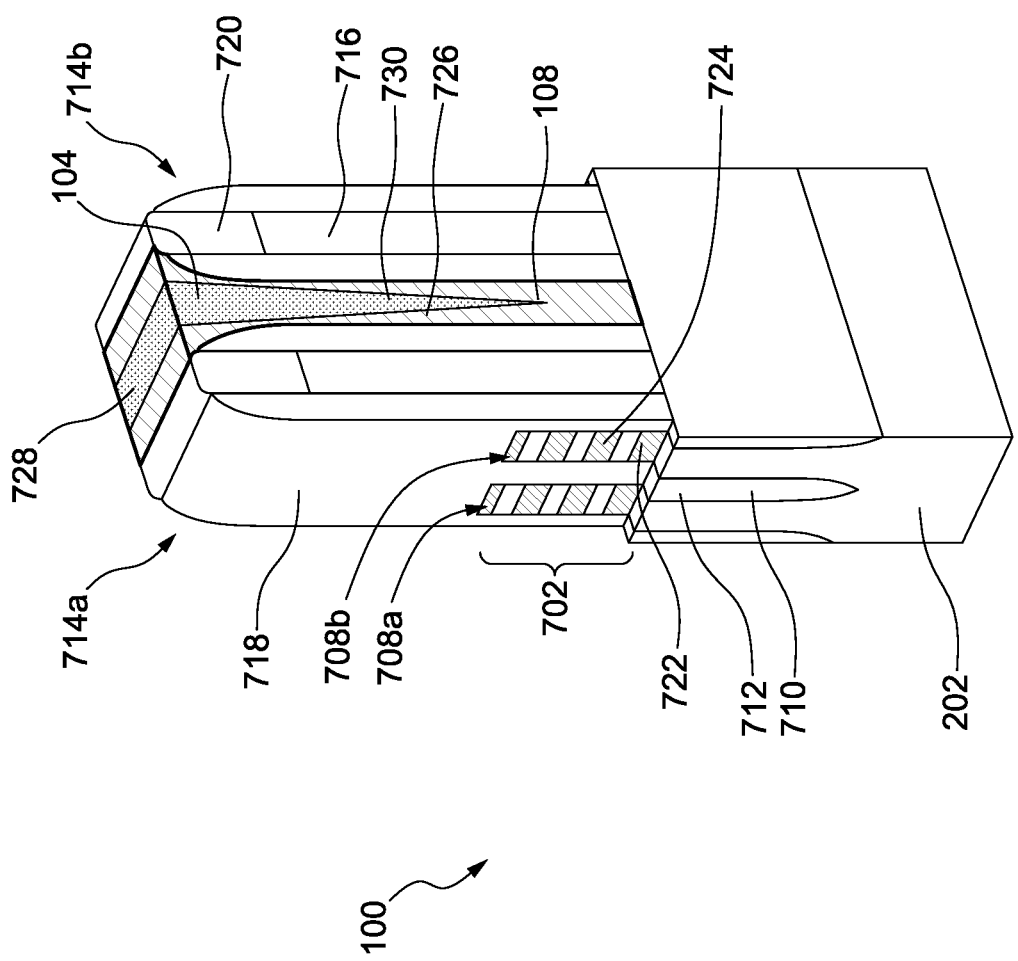
FIG. 7H is another isometric view of the structures formed to form the device(s) as described herein in accordance with examples of the present application.

In stage 614, select epitaxial layers of the epitaxy stack may be removed from the source/drain region of the fin element(s) (e.g., the region of the fin adjacent the channel region underlying the gate stack). The epitaxial layers 704 have been removed from the substrate 202 in the source/drain region of the fins 708, as shown in FIG. 7D. Further, gaps 722 may be formed in the place of the epitaxial layers 704. These gaps 722 may be filled with the ambient environment (e.g., air, $N_2$). In an implementation, the epitaxial layers 704 are removed by a selective wet etching process. In some implementations, the selective wet etching includes an APM etch (e.g., ammonia hydroxide-hydrogen peroxide-water mixture). In some implementations, the selective removal includes SiGe oxidation followed by a $SiGeO_x$ removal. For example, the oxidation may be provided by $O_3$ clean and then $SiGeO_x$ remove by an etchant such as $NH_4OH$. In an implementation, the epitaxial layers 704 are SiGe and the epitaxial layers 706 are silicon allowing for the selective removal of the epitaxial layers 704.

A spacer layer 718/724 may then be deposited on the substrate, in stage 616. The spacer layer 718/724 may be a conformal dielectric layer formed on the substrate. The spacer layer 718/724 may form spacer elements 724 on the sidewalls of the gate structure. The spacer layer 718/724 may also fill the gaps 722 provided by the removal of the epitaxial layers described in stage 614 above. The spacer layer 718/724 is disposed on the substrate 202 including filling the gaps 722 between epitaxial layers in the source/drain region of the fin elements 708.

The spacer layer 718/724 may include a dielectric material such as silicon oxide, silicon nitride, silicon carbide, silicon oxynitride, SiCN films, silicon oxycarbide, SiOCN films, and/or combinations thereof. In some implementations, the spacer layer 718/724 includes multiple layers, such as main spacer walls, liner layers, and the like. By way of example, the spacer layer 718/724 may be formed by depositing a dielectric material over the gate stack 714 using processes such as, CVD process, a subatmospheric CVD (SACVD) process, a flowable CVD process, an ALD process, a PVD process, or other suitable process. In certain implementations, the deposition may be followed by an etching back (e.g., anisotropically) the dielectric material. In some implementations, prior to forming the sidewall spacers 718/724, an ion implantation process may be performed to form lightly-doped drain (LDD) features within the semiconductor device 100.

In some implementations, after formation of the spacer layer 718/724, the spacer layer 718/724 may be etched-back to expose portions of the fin elements 708 adjacent to and not covered by the gate structure 714 (e.g., source/drain regions). The spacer layer material may remain on the sidewalls of the gate structure 714 forming spacer elements. In some implementations, etching-back of the spacer layer 718/724 may include a wet etch process, a dry etch process, a multiple-step etch process, and/or a combination thereof. While the spacer layer 718/724 may be removed from a top surface of the exposed epitaxial stack 702 and the lateral surfaces of the exposed epitaxial stack 702, as illustrated in FIG. 7C, the spacer layer 724 remains interposing the epitaxial layers 706 of the epitaxial stack 702 in the source/drain region. The spacer layer 724 between the epitaxial layers 706 may be between approximately 2-6 nm in thickness.

In stage 618, the method 600 forgoes the building of the source/drain features. The source/drain features, in previous device formation, would be formed by performing an epitaxial growth process that provides an epitaxy material cladding the portions of the epitaxy layers remaining in the fins' source/drain regions. However, when forming the VMOM capacitor, this part of the process is not completed. Therefore, rather than EPI fill between gate structures 714a, 714b, in region 726, there is no a space. The VMOM capacitor may be formed in the region 726 because of the absence of the EPI. Further, there is no need for other masks to form this space in region 726 as the EPI growth in this region 726 is simply prevented.

The method 600 then proceeds to stage 620 where an oxide diffusion (OD) dielectric 108 is formed. Referring to the example of FIG. 7F, in an implementation, an OD 108 is formed over the substrate 202. In some implementations, a contact etch stop layer (CESL) is also formed over the substrate 202 prior to forming the OD 108. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. The OD 108 can include one or more of, but is not limited to, tetraethylorthosilicate (TEOS) oxide, doped silicon oxide such as borophosphosilicate glass (BPSG), fused silica glass (FSG), phosphosilicate glass (PSG), boron doped silicon glass (BSG), other materials with a high dielectric constant, for example, $Ta_2O_5$, $HfO_2$, $SrTiO_3$, $PbTiO_3$, $KNO_3$, and/or $Al_2O_3$, and/or other suitable dielectric materials. The OD 108 may be deposited by a PECVD process or other suitable deposition technique. In some implementations, after formation of the OD 108, the semiconductor device 100 may be subject to a high thermal budget process to anneal the OD layer. As described above, the insulating layer can block some potential diffusion of APT dopants from within the substrate regions into the device channel region during such high thermal budget processing.

In some examples, after depositing the OD (and/or CESL), a planarization process may be performed to expose a top surface 728 of the OD 108. For example, a planarization process includes a chemical mechanical planarization (CMP) process which removes portions of the OD 108 (and CESL layer, if present) overlying the gate stack 714 and planarizes a top surface of the semiconductor device 100.

The method 600 then proceeds to stage 622 where a selective removal of the OD 108 in the region 726 between the gate structures 714a, 714b of the device is provided. In implementations, a portion of the OD 108 is removed down to the fin elements forming a trench. Referring to the example of FIG. 7H, the OD 108 is removed from the region 726. In some implementations, the OD 108 is removed by a selective wet etching process. In some implementations, the selective wet etching includes HF.

In stage 624, the MD 104 is formed in the trench created in stage 622. The MD 104 may be one of the terminals of the VMOM capacitor. The MD 104 may be a metal deposition formed from various metals, for example, Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. Referring to the example of FIG. 7H, in an implementation of stage 624, a MD 104 is formed within the trench 730 of the device 100. The metal deposition used within MD 104 may include a metal, metal alloy, or metal silicide. Additionally, the formation of the MD 104 may include depositions to form various structures, one or more liner layers, and one or more CMP processes to remove excessive materials and thereby planarize a top surface of the semiconductor device 100. In various implementations, the MD 104 may be formed by ALD, PVD, CVD, e-beam evaporation, or other suitable process. Further, the MD 104 may be formed separately for N-FET and P-FET transistors which may use different metal layers.

The device 100 may perform as a VMOM capacitor device, the MD 104 and gate structure 714 being formed on sides of the OD 108 to form the terminals of the VMOM capacitor. The VMOM capacitor device 100 is illustrated in isometric view in FIG. 7H. The VMOM capacitor device 100 may undergo further processing to form various features and regions known in the art. For example, subsequent processing may form contact openings, contact metal, as well as various contacts/vias/lines and multilayers interconnect features (e.g., metal layers and interlayer dielectrics) on the substrate 202, configured to connect the various features to form a functional VMOM capacitor that may include two or more terminals, including for example, the MD 104 and the gate structure 714. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 600, and some process steps described above may be replaced or eliminated in accordance with various implementations of the method 600.

Among other things, the present disclosure thus provides a capacitor in a nanosheet structure. The capacitors formed on an OD without EPI in the OD or nanosheet structure. The disclose capacitor may be formed without the need for extra masks, thus reducing cost and complexity, as well as reducing the required die area. The disclose capacitor demonstrates low leakage and high capacitance density.

Aspects of the present disclosure thus include a device that includes a substrate, and a first nanosheet structure and a second nanosheet structure disposed on the substrate. Each of the first and second nanosheet structures have at least one nanosheet forming source/drain regions and a gate structure including a conductive gate contact. A first oxide structure is disposed on the substrate between the first and second nanosheet structures. A conductive terminal is disposed in or on the first oxide structure. The conductive terminal, the first oxide structure and the gate structure of the first nanosheet structure define a capacitor.

Another aspect of the present disclosure includes a device having a first nanosheet structure comprising at least one nanosheet forming source/drain regions and a gate structure including a conductive gate contact. An oxide structure is provided that has no p-type epitaxy (P-EPI) or n-type epitaxy (N-EPI) in or on the oxide structure. A conductive terminal is disposed in or on the oxide structure. The conductive terminal, the oxide structure and the gate structure of the first nanosheet structure form a first capacitor.

Further aspects of the disclosure include a method where fin elements are patterned from an epitaxial stack. A gate structure is formed over the fin elements, and an OD is formed adjacent the gate structure. An MD is formed within the OD. The gate structure is connected as a first terminal of a VMOM capacitor, and the MD is connected as the second terminal of the VMOM capacitor, wherein the OD is a dielectric between the gate structure and the MD.

The foregoing outlines features of several examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a first nanosheet structure and a second nanosheet structure disposed on the substrate, each of the first and second nanosheet structures comprising:
      at least one nanosheet forming source/drain regions;
      a gate structure including a conductive gate contact;
   a first oxide structure disposed on the substrate between the first and second nanosheet structures;
   a conductive terminal disposed in or on the first oxide structure;
   wherein the conductive terminal, the first oxide structure and the gate structure of the first nanosheet structure define a capacitor.

2. The device of claim 1, wherein there is no epitaxy (EPI) in or on the first oxide structure.

3. The device of claim 2, wherein there is no N-type EPI (N-EPI) in or on the first oxide structure.

4. The device of claim 2, wherein there is no P-type EPI (P-EPI) in or on the first oxide structure.

5. The device of claim 1, further comprising:
   a third nanosheet structure disposed on the substrate; and
   shallow trench isolation (STI) separating the first nanosheet structure and the third nanosheet structure.

6. The device of claim 5, wherein the conductive terminal, the STI and the gate structure of the first nanosheet structure define a second capacitor.

7. The device of claim 6, wherein the conductive terminal, the STI and the gate structure of the second nanosheet structure define a third capacitor.

8. The device of claim 6, wherein a first depth of the conductive terminal in the OD deeper than a second depth of the MD in the STI.

9. The device of claim 8, wherein the first depth is more than two times the second depth.

10. The device of claim 5, wherein the conductive terminal, the first oxide structure and the gate structure of the second nanosheet structure define a second capacitor.

11. The device of claim 1, wherein the conductive terminal comprises metal.

12. The device of claim 1, wherein the gate structures of the first and second nanosheet structures each comprise polysilicon (PO).

13. The device of claim 1, wherein the capacitor formed by the conductive terminal, the first oxide structure and the gate structure of the first nanosheet structure define a standard cell.

14. The device of claim 1, wherein the capacitor formed by the conductive terminal, the first oxide structure and the gate structure of the first nanosheet structure are designed according to logic rules.

15. The device of claim 1, further comprising a second oxide structure disposed on the substrate adjacent the third nanosheet structure, wherein a first width of the first oxide structure is wider than a second width of the second oxide structure.

16. The device of claim 1, wherein the gate structure comprises a gate stack that wraps around all sides of the source/drain regions to form a gate all around (GAA) structure.

17. A device, comprising:
   a first nanosheet structure comprising at least one nanosheet forming source/drain regions and a gate structure including a conductive gate contact;
   an oxide structure, wherein there is no p-type epitaxy (P-EPI) or n-type epitaxy (N-EPI) in or on the oxide structure;
   a conductive terminal disposed in or on the oxide structure;
   wherein the conductive terminal, the oxide structure and the gate structure of the first nanosheet structure form a first capacitor.

18. The device of claim 17, further comprising:
   a second nanosheet structure comprising at least one nanosheet forming source/drain regions and a gate structure including a conductive gate contact;
   wherein the oxide structure is disposed between the first nanosheet structure and the second nanosheet structure;
   wherein the conductive terminal, the oxide structure and the gate structure of the second nanosheet structure define a second capacitor.

19. A method, comprising:
   providing a substrate;
   disposing a first nanosheet structure and a second nanosheet structure on the substrate, each of the first and second nanosheet structures comprising:
   at least one nanosheet forming source/drain regions;
   a gate structure including a conductive gate contact;
   forming a first oxide structure on the substrate between the first and second nanosheet structures;
   forming a conductive terminal in or on the first oxide structure;
   wherein the conductive terminal, the first oxide structure and the gate structure of the first nanosheet structure define a capacitor.

20. The method of claim 19, further comprising: forgoing epitaxial growth in or on the first oxide structure.

* * * * *